United States Patent
Kubernus et al.

[11] Patent Number: 5,961,335
[45] Date of Patent: Oct. 5, 1999

[54] DECENTRALIZED INPUT/OUTPUT MODULE FOR A DATA BUS

[75] Inventors: Gerhard Kubernus, Hirschaid-Sassanfahrt; Alexander Schuir; Holger Strack, both of Bamberg, all of Germany

[73] Assignee: Wieland Electric GmbH, Bamberg, Germany

[21] Appl. No.: 08/972,953

[22] Filed: Nov. 19, 1997

[30] Foreign Application Priority Data

Nov. 22, 1996 [DD] German Dem. Rep. .......... 196 48 351

[51] Int. Cl.⁶ .................................................... H01R 9/09
[52] U.S. Cl. .......................................... 439/76.1; 439/713
[58] Field of Search ..................... 439/76.1, 713

[56] References Cited

U.S. PATENT DOCUMENTS

| | | | |
|---|---|---|---|
| 3,411,130 | 11/1968 | Bushey | 439/660 |
| 4,744,006 | 5/1988 | Duffield | 439/61 |
| 4,758,928 | 7/1988 | Wierec et al. | 439/76.1 |
| 5,099,391 | 3/1992 | Maggelet et al. | 439/76.1 |
| 5,446,622 | 8/1995 | Landry et al. | 439/76.1 |
| 5,546,282 | 8/1996 | Hill et al. | 439/61 |
| 5,641,313 | 6/1997 | Hohorst | 439/709 |
| 5,741,142 | 4/1998 | Dux et al. | 439/76.1 |

FOREIGN PATENT DOCUMENTS

| | | |
|---|---|---|
| 7020679 | 5/1970 | Germany . |
| 44 02 002 | 7/1995 | Germany . |
| 296 06 007 | 8/1996 | Germany . |
| 196 05 698 | 4/1997 | Germany . |

OTHER PUBLICATIONS

Advertisement of the firm Phönix, "Neu '77" (1977), 4 pages.

*Primary Examiner*—Neil Abrams
*Assistant Examiner*—T C Patel
*Attorney, Agent, or Firm*—Venable; Gabor J. Kelemen; Allen Wood

[57] ABSTRACT

An input/output module for a data bus includes an insulating housing that is secured on a support rail, with the housing being provided with terminals to receive wires of the bus at side-by-side positions on a surface of the housing. The housing is mounted so that it can swivel with respect to a supporting rail. A printed circuit board can be inserted like a drawer into the housing, and once the printed circuit board is completely inserted, the electronic components on the printed circuit board are electrically connected to the bus.

18 Claims, 7 Drawing Sheets

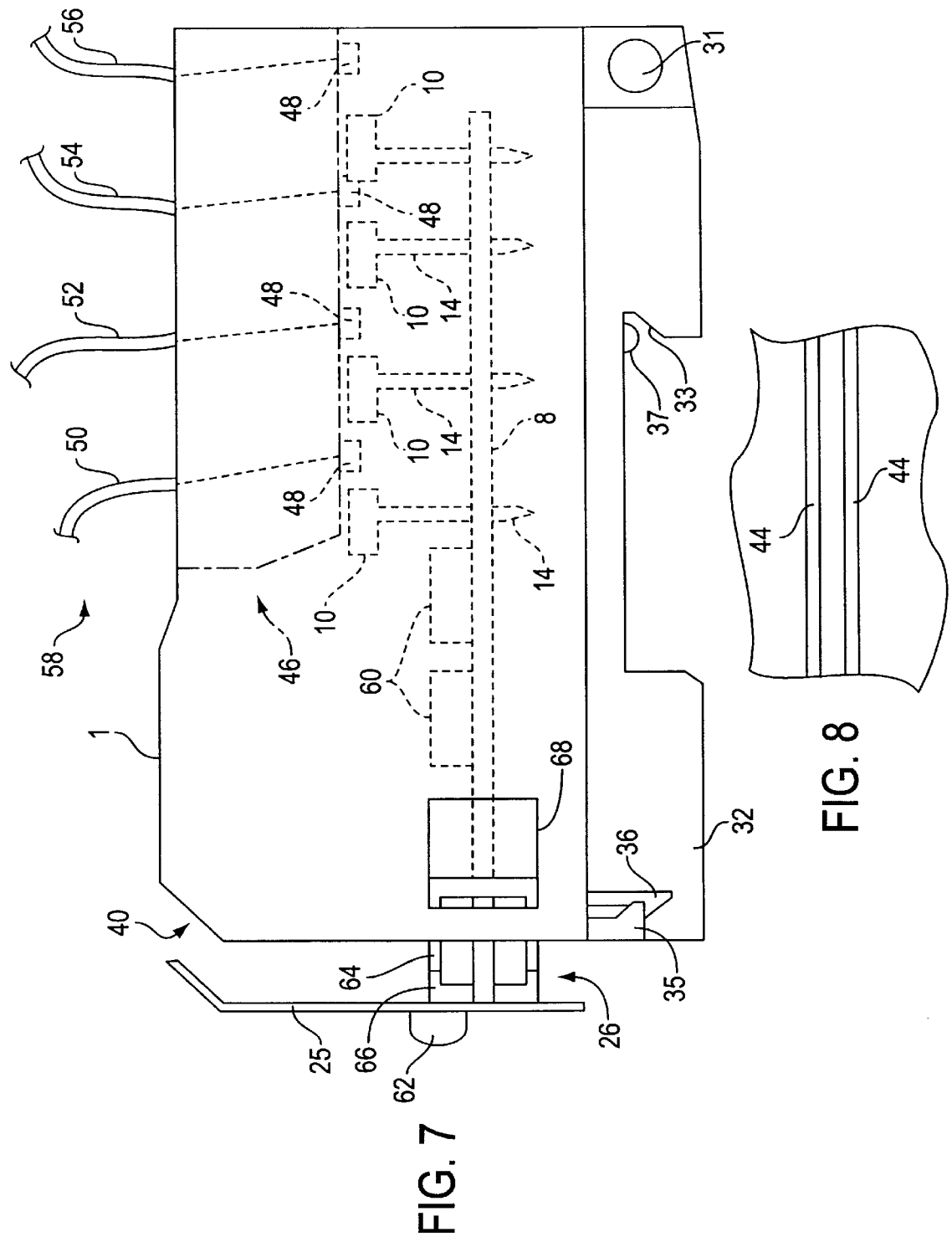

DECENTRALIZED INPUT/OUTPUT MODULE FOR A DATA BUS

CROSS REFERENCE TO RELATED APPLICATION

This application claims the priority of application Serial Number 196 48 351.4, filed Nov. 22, 1996 in Germany, the subject matter of which is incorporated herein by reference.

BACKGROUND OF THE INVENTION

The present invention concerns an input/output module of the type which includes an insulating housing that can be fastened to a support rail, connecting terminals for wiring, and electrical components that are arranged on a printed circuit board. Such input/output modules are known, for example, from German application DE-A 4,402,001 (corresponding to U.S. Pat. No. 5,641,313) as well as German application DE-A 4,402,002.

In particular it is known to arrange several input/output modules (I/O modules) side-by-side on support rails so that they can be housed, for example, in switch cabinets. These side-by-side arranged I/O modules are then connected mechanically and electrically. In that case, only the first module, meaning a base module or bus coupler, contains a bus-coupling component, which establishes the logical connection between a bus and the I/O modules. This is known, for example, for an interior installation from German DE-C 19,605,698. Problematic in this case is the accessibility of the individual modules for replacement and service purposes. In particular, it is always necessary to completely dismantle the wiring, resulting in a high labor and assembly expenditure.

SUMMARY OF THE INVENTION

Starting with this known state of the technology, it is the object of the present invention to simplify and improve the design of an input/output module for a data bus. The solution according to the invention lies in providing a module of the above-mentioned type which is characterized in that the insulating housing is positioned such that it can swivel with respect to the support rail, in that connecting contacts are arranged side by side on a surface of the insulating housing, in that the printed circuit board can be inserted like a drawer into the insulating housing, and in that once the printed circuit board is completely inserted, the electronic components are connected with the connecting contacts such that they are electrically conducting.

In accordance with one aspect of the invention, the input/output module according to the invention has an insulating housing adaptable to a support rail. This option of mounting input/output modules on support rails makes it possible to arrange several insulating housings side-by-side on one support rail. Of course, it is also possible to arrange several support rails with insulating housings side-by-side, or one below the other, inside a switch cabinet. Connecting contacts are arranged side-by-side on one exterior side of the insulating housing. A printed circuit board with printed-on conductor strips for the data bus lines and the power supply of the input/output electronics is arranged inside the insulating housing.

The core of the invention consists in that the printed circuit board can be inserted like a drawer into the insulating housing, with the wiring that is connected to the connecting contacts being conductively connected with the electronic components on the printed circuit board once the printed circuit board is completely inserted. The insulating housing is furthermore mounted in a swivelling manner on the support rail so that the printed circuit board can be inserted into the insulated housing mounted on the support rail. Thus, for the installation or removal of the printed circuit board from the insulating housing, the insulated housing can simply be swiveled out of the operating position for the module and away from the support rail, and the circuit board can then be installed or removed accordingly. Advantageous in this connection is the separation of the printed circuit board, which is located inside the insulating housing, from the installation of the wiring, which is attached to the connecting contacts on the surface outside of the housing. It is easy to replace the printed circuit board in this way, without first having to detach the wiring which requires a high installation expenditure. This is particularly advantageous for inspection and service purposes as well as when installing modified, improved versions of the technology or electronic components arranged on the circuit board, since the printed circuit board can simply be replaced while the wiring, with its high installation cost, is maintained.

The input/output module according to the invention is particularly suitable for adaptation to top hat rails, generally used in the industry. In order to install a swivel arm on the top hat rail such that is swivels, it is attached with a hinge to the insulating housing. The swivel arm has a locking recess, designed to complement the shape of the top hat rail, for securing it to the top hat rail. Due to this design, several modules can be locked to the top hat rail in an in-line arrangement. It simplifies production technology if the swivel arm as well as the insulating housing are injection-molded from the same insulating plastic material.

The insulating housing preferably has a rectangular parallelepiped shape. One of the two large surfaces of the rectangular parallelepiped in this case holds the connecting contacts. The terminal points for the connecting contacts are in this case combined advantageously into standard terminal strips. The terminal points in particular can simply be designed as spring terminals or screw terminals. With the aid of a corresponding number of terminal strips, it is easily possible to design actuators, sensors or similar devices in any optional connection technology, e.g. in the one-, two-, three- or multiple-conductor technology. While the surface of the insulating housing that is provided with the terminal strips serves as the connecting-contact surface of the insulating housing, a hinge for the swiveling arm is preferably mounted in the region of the lower edge of the second large surface of the rectangular parallelepiped, which faces away from the connecting contact surface. This arrangement of the hinge ensures a large swiveling lift for the housing, such that the housing can be swiveled away from the support rail at an angle of up to 90°. As a result of this large swiveling lift, the housing can be accessed particularly easily from many sides after it is swiveled out of the operating position for the module and away from the support rail. The described arrangement of the hinge also has the advantage that the insulating housing rests flat against the swivel arm and thus also the support rail for a swiveling position that corresponds to the operating position of the module, thus minimizing the space required for the insulating.

Preferably, the insulating housing can be locked in the operating position to ensure the continued operating capability of the module.

The printed circuit board is inserted into the housing through a small side of the rectangular parallelepiped. One advantageous embodiment provides that one of the short, small sides of the rectangular parallelepiped be used, preferably the one facing away from the hinge. In order to create an opening suitable for inserting the printed circuit board, the complete small side of the housing is designed to be open, meaning there is no wall. Guide elements are provided on the insides of the side walls that are perpendicular to the small side for inserting the printed circuit board, which elements are preferably adapted to the internal thickness of the printed circuit board. These guide rails can have a mechanical coding that functions together with the printed circuit board to ensure that in each case only a pre-defined type of printed circuit board can be inserted into a correspondingly pre-defined housing type.

In order to close up the housing in the operating position, a housing side wall is formed onto the printed circuit board that normally runs perpendicular to the printed circuit board plane. Once the printed circuit board is completely inserted, this housing side wall completely closes off the small side of the housing, which is used to insert the printed circuit board. The outside of this housing side wall may have a printed-on type designation or the like. Of course, printing it on is only one of many ways to affix written information and/or a type designation. A type plate can also be glued or riveted to the housing side wall, or it may hold a bracket for a replaceable type plate. Since the housing side wall is connected rigidly with the printed circuit board, it is advantageously suited for mounting an information carrier for technical data for the printed circuit board or the electronic components arranged on the printed circuit board.

A slide that can be displaced to the side may be movably arranged on the housing side wall formed onto the printed circuit board. This slide on the one hand serves to positively lock the printed circuit board in place by engaging into a respective opening on the insulating housing. This opening is advantageously arranged in a side wall that is mounted rigidly on the insulating housing. By installing a respective opening in the side wall of the neighboring housing, an additional form-fitting way of securing neighboring housings to each other is realized. It is advantageous if a slide with a rectangular cross section is used. In conjunction with the coordinated openings in the housing side walls, this slide forms a four-surface guide that simplifies its operation. If the slide is displaced in the direction of the neighboring housing, the printed circuit board is on the one hand secured against an unintended pulling out while, on the other hand, this prevents an undesired swiveling of the insulating housing from the operating position for the module.

In a modification of the invention, additional electrical connecting contacts may be installed in the slide. These are designed advantageously as contact plugs. As a result of the joint operation with a complementary contact socket in the neighboring housing, it is possible to create an electrical connection between two neighboring housings. By way of these electrical connections, the neighboring I/O modules are interconnected on the one hand with each other and on the other hand with the bus coupler or base module. This is advantageous, for example, if certain functions must be interrupted for safety reasons during the removal of printed circuit boards. Since removal of the printed circuited board is possible only after the slide is unlocked, meaning after the slide is removed from the opening in the neighboring housing, the connection between the contact plug, arranged in the slide, and the associated contact socket is also interrupted automatically.

The slides designed as contact plugs as well as their contact sockets with complementary design can be omitted with an I/O module if this module already comprises the bus coupling module as a "stand-alone" bus coupler.

The input/output module may be provided with a spring-contact element which is designed to be part of the swivel arm and which penetrates the insulating housing in the direction of the printed circuit board. With the aid of the contact spring, it is possible to establish a contacting, electrical connection between the printed circuit board on the one hand and conductors mounted on the top hat rail on the other hand. The installation of such conductors on the top hat rail is described, for example, in detail in the above-cited references in the "Background Of The Invention" section, to which we want to refer emphatically in this connection.

The connecting contacts on the outside of the insulating housing are electrically connected to the printed circuit board when the printed circuit board is fully inserted into the housing. For the contacting, pins are preferably formed onto the sides of the terminal strips that face away from the terminal points of the wiring. These pins fit through corresponding bore holes in the surface of the housing that form the connecting contact surfaces and project in the direction of the interior of the insulating housing and thus the printed circuit board. Contact springs with two arms are in turn provided on the printed circuit board. The contact spring arms flank the pins of the terminal strips between them once the printed circuit board is inserted. On their respectively free ends, the spring arms form a gap between them, through which the pins that are not assigned to the respective contact springs can simply be pushed. It is possible in this way to arrange several pins one after another in a line and still be able to insert and remove the printed circuit board without problems. Consequently, the contact springs are designed such that they can simply be pushed through the pins, to which other contact springs have been assigned in the circuit.

Protective conductors or a ground connection may be bridged internally in a respectively assigned terminal strip. This internal bridging for terminal strips is well known from the prior art. The internal bridging is the result, for example, of safety requirements. For example, it is not permissible for the printed circuit board to include the protective conductor, because it would be too easy for a conductor printed onto the printed circuit board to break, thereby rendering the protective conductor non-functional, without this being noticed immediately during the module operation. In that case, only one pin is provided for the total, bridged terminal strip and correspondingly only one clamping spring on the printed circuit board. One principal advantage of the complete invention consists in that the electronic components assigned to the printed circuit board are completely uncoupled from the wiring.

A pair of neighboring terminal strips may be arranged with their terminal points or connecting sockets providing connection openings that are offset. A connecting opening of one of the terminal strips in that case falls along an imaginary line in the space between two neighboring connecting openings of the other terminal strip. A continuous optical waveguide is assigned to each terminal strip. Light-emitting diodes associated with the waveguide are also arranged such that they are offset against each other, in accordance with the terminal arrangement, so that one light-emitting diode is clearly assigned to each connecting opening or each terminal input. A cursor key is arranged on the bus coupling component assigned to the input/output module and can be used to actuate each input or output of the terminal strip, which is visible on the outside and to the operator in that the respectively coordinated diode lights up. The operating capacity of the input or output can be checked through a simple red-green switching of the respective diode.

These procedural steps make it possible, for example, to assign 24 volt power wiring to one terminal strip and 5 volt logic wiring to another terminal strip. In this way. It is therefore possible with the aid of the invention to uncouple 24 volt power components on the printed circuit board completely from the 5 volt logic components.

BRIEF DESCRIPTION OF THE DRAWINGS

The invention will be explained in more detail below with the aid of the following drawings, in which:

FIG. 7 is a side view of the module with the printed circuit board only partially inserted.

FIG. 8 is a side view showing guide rails on a broken-away portion of a side wall of the housing.

DESCRIPTION OF THE PREFERRED EMBODIMENTS

Figure 1:
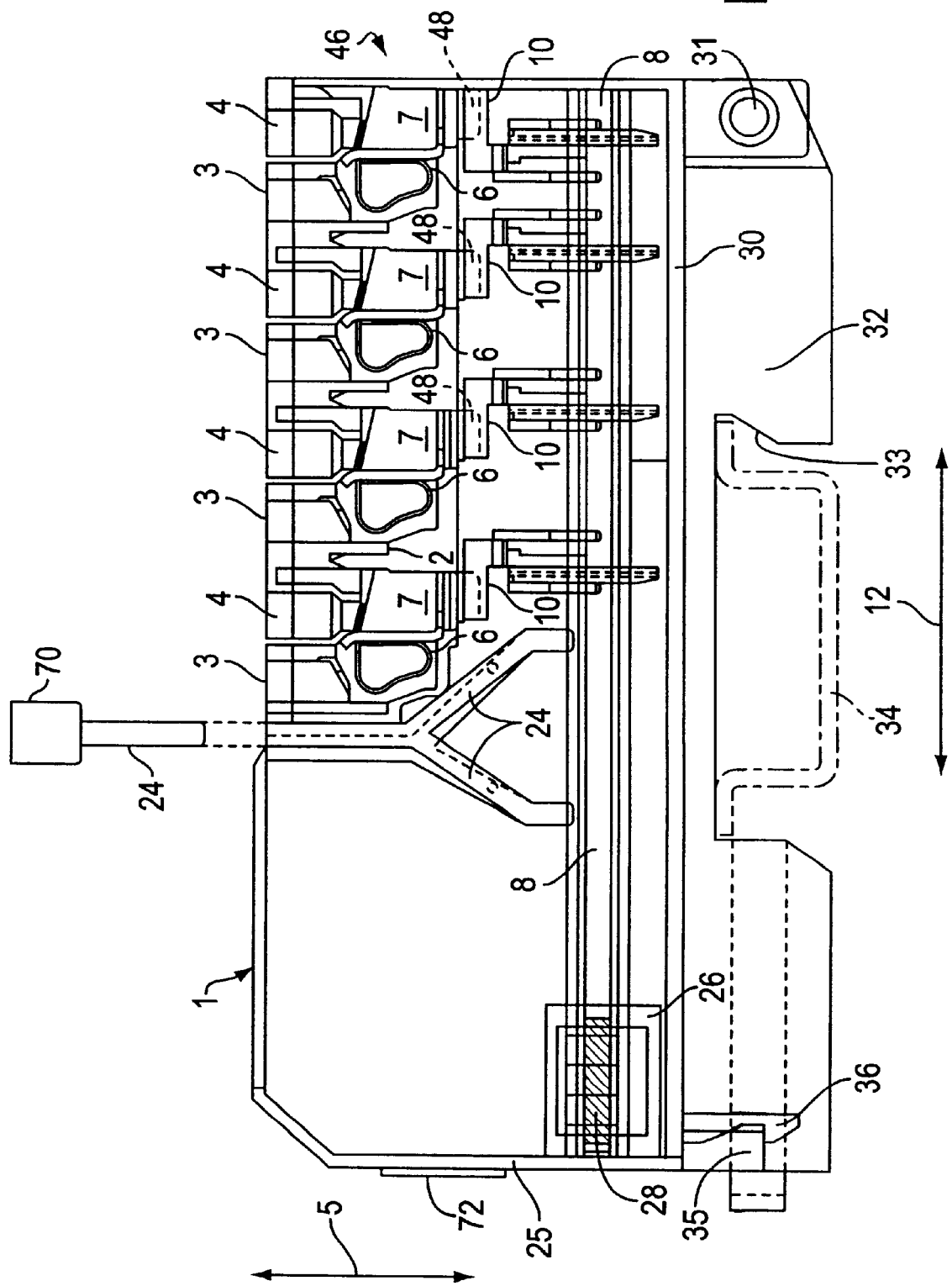
FIG. 1 is a partial side-view section of an input/output module according to the invention in its operating position.

An overview of the input/output module of the present invention will be briefly described with reference to FIGS. 7 an 8 before a more detailed discussion is presented with respect to the remaining figures. In FIGS. 7 and 8, an insulating housing 1 has an open end 40. In its interior, the side walls of the housing 1 have guide rails 44 which permit a printed circuit board 8 to be inserted into or withdrawn from the housing 1 via its open end 40. A terminal assembly 46 is mounted inside housing 1, and includes metal contact portions 48 which project toward the surface of printed circuit board 8 when the printed circuit board is in its inserted position. The terminal assembly 46 permits wires 50, 52, 54 and 56 of a bus 58 to be connected to the contact portions 48, as is illustrated schematically in FIG. 7 by dotted lines. Although not shown in FIG. 7, the bus 58 includes more than four wires; the wires 50 and 52 are simply the first wires in respective rows. Also not shown in FIG. 7 are additional contact portions 48 that are connected to the additional wires in these rows.

Electrical components such as integrated circuits 60 are mounted on printed circuit board 8 and are electrically connected by printed circuit wiring (not shown) and by pins 14 to spring arms 10 of contact springs. Just as the wires 50 and 52 shown in FIG. 7 are merely the first wires of respective rows, the left-most pair of pins 14 shown in FIG. 7 and their spring arms 10 are merely the first in respective rows, with more behind the ones that are shown.

With continuing reference to FIG. 7, the spring arms 10 carried by the printed circuit board 8 are positioned for electrical connection to the contact portions 48 of the terminal assembly 46 when the printed circuit board 8 is fully inserted into the housing 1, thereby connecting at least some of the electrical components on printed circuit board 8 to the bus 58. Consequently, the printed circuit board 8 can be removed from the housing 1 and replaced by a new printed circuit board (not illustrated) without disturbing the connections of the bus 58 to the terminal assembly 46. The module of the present invention thus permits a substantial amount of skilled labor to be saved when printed circuit boards are exchanged, since such an exchange can be conducted without disconnecting and then re-connecting the wires of the bus 58.

A side wall 25 is attached to one end of printed circuit board 8 and closes the open end 40 of housing 1 when the printed circuit board 8 is fully inserted. A hollow, rectangular slide 26 is connected to a knob 62 (which is not shown in the remaining figures) through a slot (not illustrated) in the side wall 25. The printed circuit board 8 has slots (not illustrated in FIG. 7) which permit the slide 26 to move back and forth when the knob 62 is moved back and forth.

The slide 26 has a wide portion 64 and a cut-away narrow portion 66. The narrow portion 66 permits the wide portion 64 of slide 26 to protrude through an opening 68 in the wall of housing 1 and thereby lock the printed circuit board 8 into position after it has been fully inserted into housing 1. Furthermore, if another input/output module (not illustrated) is mounted adjacent to the one shown in FIG. 7 and if this adjacent module has a housing wall with an opening that is aligned with the opening 68, the two modules can be locked together by the slide 26. Furthermore, in an alternative embodiment that will be described later, the slide 26 can be provided with electrical contacts to connect circuitry on the printed circuit board 8 with a printed circuit board in the adjacent module.

With continuing reference to FIG. 7, one end of a swivel arm 32 is connected to the housing 1 by a hinge 31, so that the housing 1 can pivot away from the swivel arm 32. However, the housing 1 is provided with a detent hook 36 for engagement with a locking jaw 35 at the other end of the swivel arm 32 in order to latch the housing 1 to the swivel arm 32. Furthermore, the swivel arm 32 has a locking recess 33 which permits the swivel arm 32 to be locked to a supporting rail (not shown in FIG. 7), as will be discussed in more detail hereafter.

Turning next to FIG. 1 to begin a more detailed description of the input/output module according to the invention, the insulating housing 1 has a rectangular parallelepiped shape. The terminal assembly 46 includes four terminal strips 3 that are formed on its rectangular parallelepiped surface that forms a connecting contact surface 2. The terminal strips 3 have connecting openings 4 that hold the wiring. The wiring (not shown in FIG. 1) consists of individual conductors, which are inserted in plug-in direction 5 into the connecting openings 4. The terminal strips 3 are provided with spring terminals, of which the clamping springs 6 are visible. Pins 7 with a flag-type design extend through the connecting contact surface 2 in the plug-in direction 5. The pins 7 of the individual terminal points of the individual terminal strips are connected by means of the contact portions 48 of pins 7 with the printed circuit board 8 arranged in the insulating housing 1.

Figure 4:
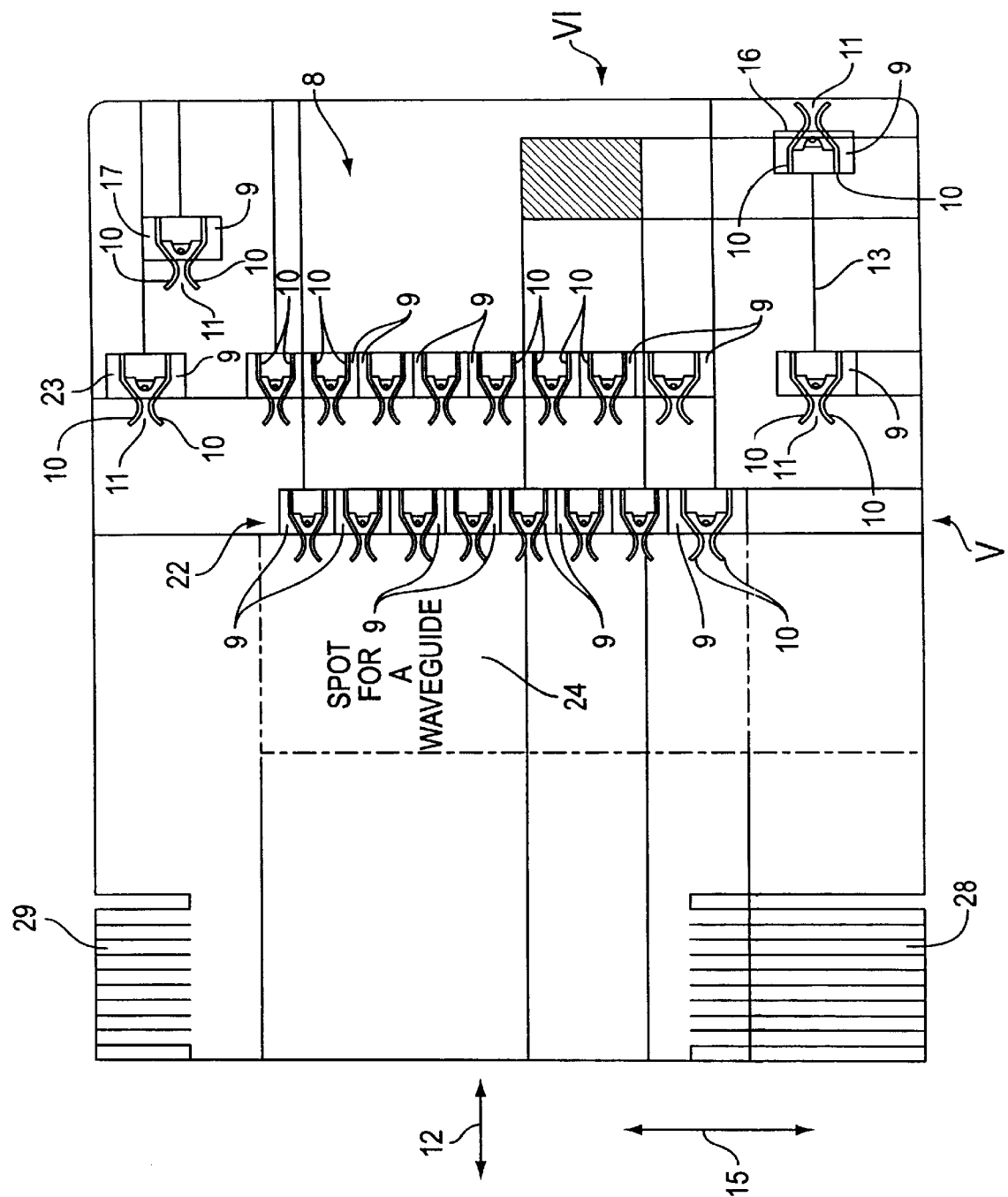
FIG. 4 is a view from above of the printed circuit board.
Figure 5:
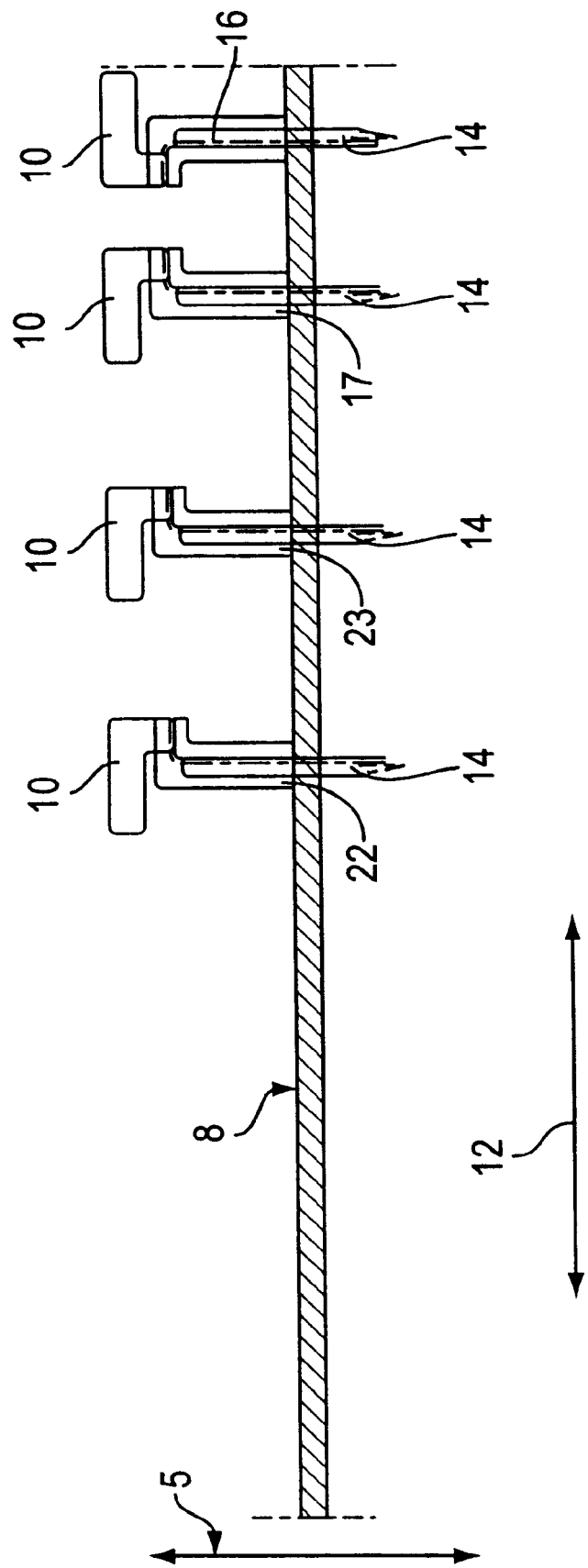
FIG. 5 is a view from the side of the printed circuit board shown in FIG. 4, according to the arrow V in FIG. 4.
Figure 6:
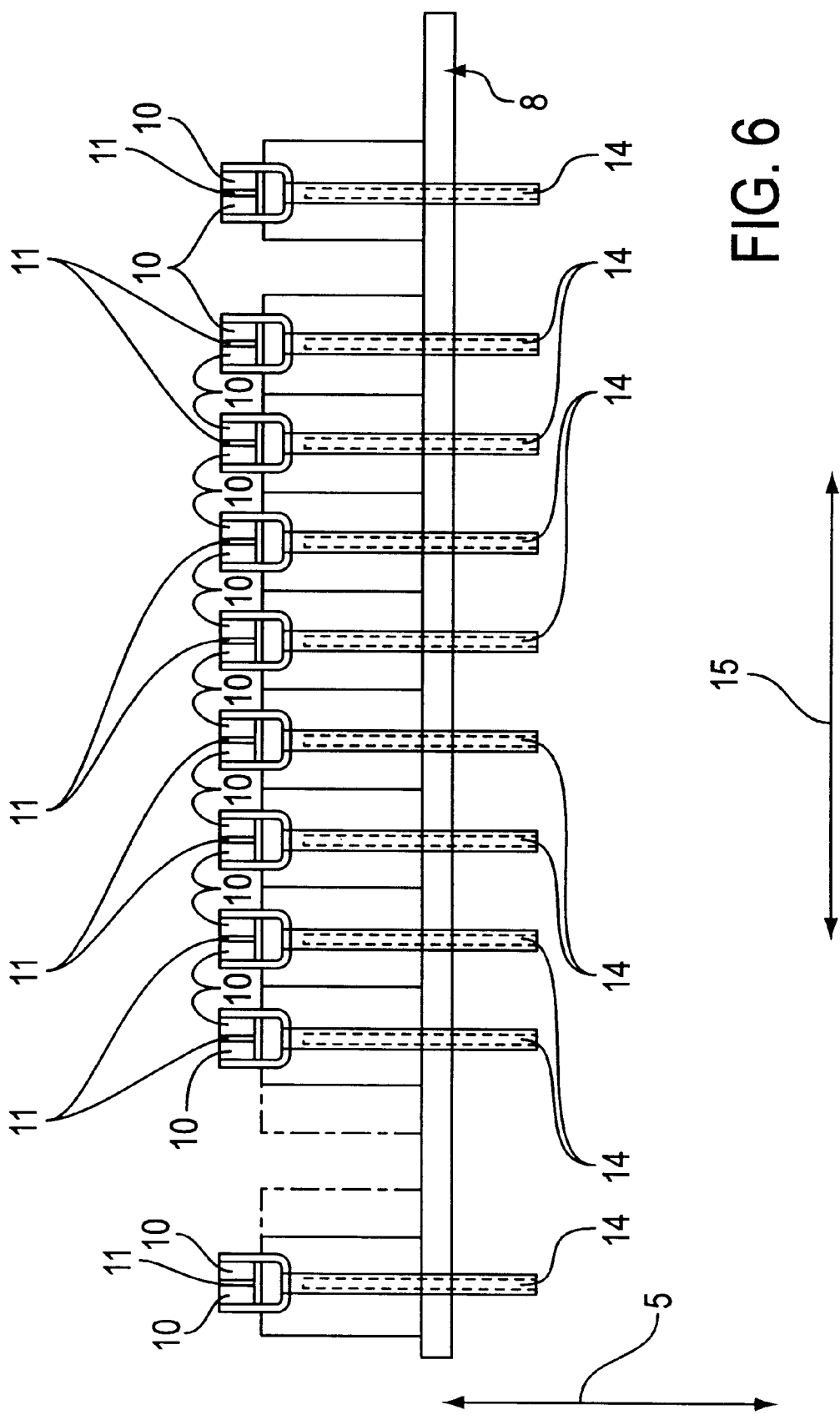
FIG. 6 is a view from the side of the printed circuit board according to the arrow VI in FIG. 4.

For this, the printed circuit board 8 has individual contact springs 9. Referring now to FIGS. 4–6, the contact springs 9 have respectively two spring arms 10. The spring arms 10 of a contact spring 9 are designed such that they are convex to each other in a mirror-inverted arrangement and form a slot 11 between them. This slot 11 is designed such that the contact springs 9 with their convex regions exert a spring force on the contact portions 48 of the preferably flag-type pins 7 positioned between the spring arms 10. On the other hand, it is easily possible with the aid of slot 11 to push individual pins 7 through the individual clamping springs 6 when the printed circuit board 8 is inserted in insertion direction 12, which is perpendicular to the plug-in direction 5, so as to be able to push the printed circuit board 8 into its final assembly position. It is possible in this way to arrange several contact springs 9 or several pins 7 in one insertion plane, which is indicated by the auxiliary line 13 in FIG. 4.

The contact springs 9 are secured with their contact pins 14 in the printed circuit board 8. FIG. 6 shows that, on the printed circuit board 8, a number of contact springs 9 corresponding to the number of the individual terminal points on the terminal strips 3 are arranged side-by-side in the lateral direction 15, the direction 15 being oriented at a right angle to the plug-in direction 5 and also at a right angle to the insertion direction 12.

The two right terminal strips 3 shown in FIG. 1 serve to connect a protective conductor or the ground. Both of these terminal strips 3 are bridged internally, so that only one pin 7 and correspondingly one contact spring 9 are provided on the printed circuit board S. This is shown in FIGS. 4 and 5. There, the contact spring 9 adjacent to the right edge of the printed circuit board forms a protective conductor 16 connection. The ground connection 17 is positioned next to the protective conductor 16 connection in insertion direction 12 (FIG. 4/FIG. 5).

Figure 2:
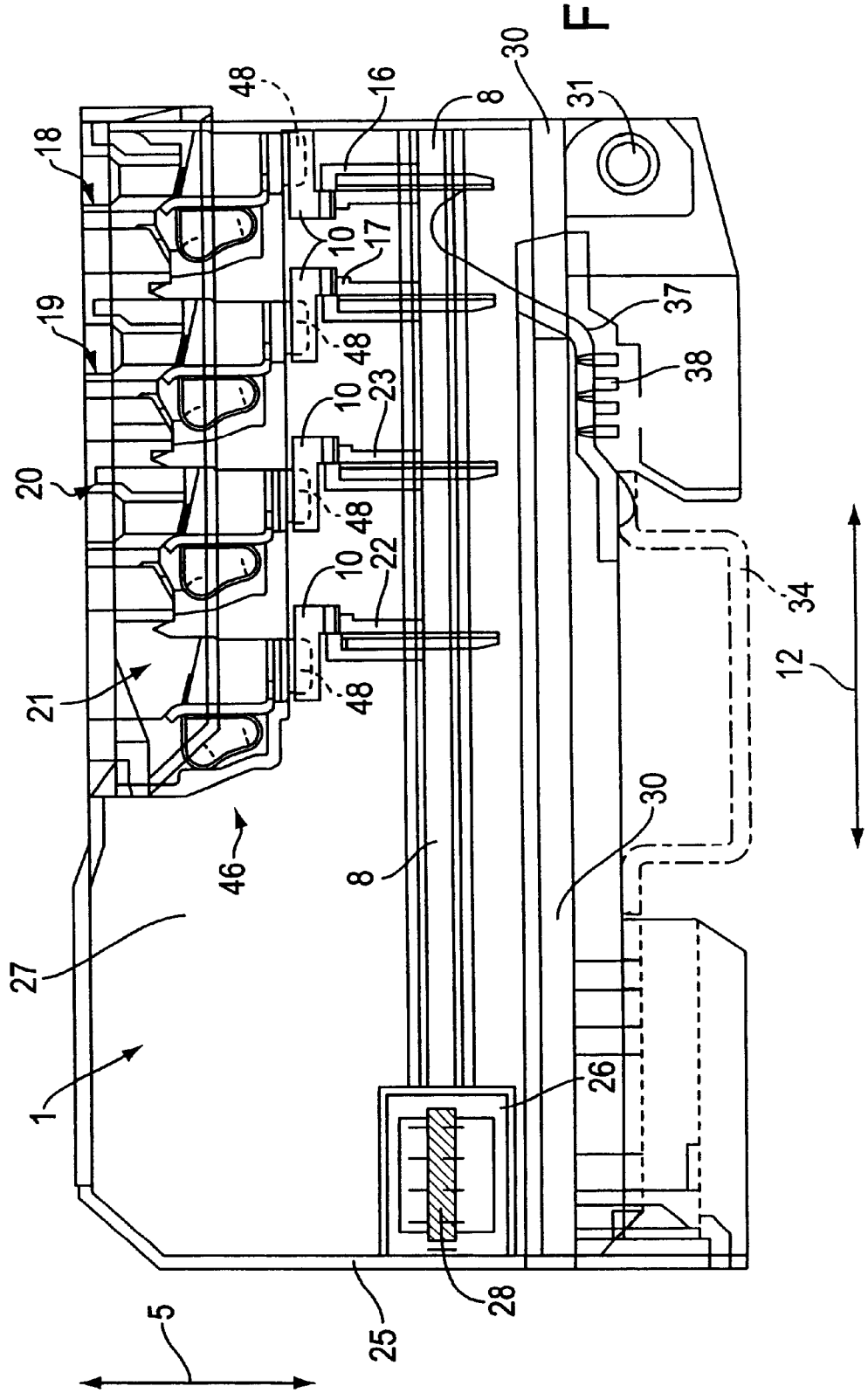
FIG. 2 is a section according to FIG. 1, but with a sectional plane where a spring-contact element effective between the swivel arm and printed circuit board is visible.

In FIG. 2, the protective conductor terminal strip is consequently given the reference number 18 and the ground terminal strip the reference number 19. Reference number 20 identifies a positive terminal strip that is arranged in insertion direction 12 beside the ground terminal strip 19. Reference number 21 identifies a signal terminal strip that is arranged in insertion direction 12 beside the positive terminal strip 20. The signal contact springs 22 are assigned on the printed circuit board 8 to the signal terminal strip 21. Correspondingly, the positive contact springs 23 are assigned to the positive terminal strip 20 on the printed circuit board 8.

Two optical waveguides 24 are furthermore shown in FIG. 1. As schematically shown in FIG. 1, the optical waveguides are connected to light emitting diodes 70, supplied by the waveguides 24, for monitoring the operation of the individual connections of the signal terminal strips 21 or the positive terminal strip 20 that forms the power component.

The housing side wall 25, which is not shown in FIGS. 4, 5, and 6, is connected to the printed circuit board 8 as shown in FIGS. 1 and 2. If the printed circuit board 8 is completely inserted into the insulating housing 1 in insertion direction 12, the housing side wall 25 closes off the insulating housing 1 from the insertion side. The housing side wall 25 comprises an information carrier 72 as shown in FIG. 1. The information carrier 72 is designed in the form of a type plate and contains information specifying the circuit board 8 in detail. The slide 26 with a rectangular cross-sectional shape is also indicated in FIG. 1. The slide 26 it positioned on the housing wall 25 such that is can be moved in lateral direction 15 and serves to lock the housing when in the operating position as illustrated in FIG. 1. In the lateral direction 15, the slide 26 projects through the opening 68 (see FIG. 7), which is located in the housing wall 27 marked in FIG. 2. The wall 27 with the opening 68 extend in insertion direction 12, perpendicular to the housing side wall 25. Another insulating housing (not illustrated) adjacent to the insulating housing 1 has an opening that corresponds to the opening 68 and through which the slide 26 extends as well. With its guide elements that are not shown in the figures, the slide 26 in an alternative embodiment is provided with connectors (not illustrated) to connect a contact panel 28 of the printed circuit board 8, arranged in its insulating housing 1, with a connecting contact panel 29 for a printed circuit board in the adjacent insulating housing.

Finally, it is possible to see in FIG. 1 the hinge 31 on the rear side 30 of insulating housing 1, which is facing away from the connecting contact surface 2. The swivel arm 32 is hinged by means of the hinge 31 to the insulating housing 1. The locking recess 33 is formed as part of the swivel arm 32. The swivel arm is placed with the locking recess 33 onto a top hat rail 34, which serves as a supporting rail. In the operating position shown in FIG. 1 for the input/output module, the swivel arm 32 with its locking jaw 35 is locked in place at the insulating housing 1 in that it is gripped from behind by the detent hook 36, which is formed onto the insulating housing 1. A spring contact element 37 is visible in FIG. 2. In the operating position for the input/output module shown in FIGS. 1 and 2, the spring contact element 37 rests against the top hat rail 34. FIG. 2 shows that the spring contact element 37 extends through the rear side 30 of the insulating housing 1 and in this way creates a conductive contact between the top hat rail 34 and the printed circuit board 8. Indicated in the drawing is a contacting region 38 that is formed onto the spring contact element 37 for realizing additional electrical contacts.

The mode of operation for the device (see FIG. 3) is as follows:

In order to open the insulating housing 1 and to remove the printed circuit board 8 in insertion direction 12, the slide 26 is initially moved in the lateral direction 15 into its opened position. (It is noted that, in the above-mentioned alternative embodiment in which the slide 26 is provided with connectors to connect the connecting contact panel 28 of the printed circuit board 8 to the connecting contact panel 29 of a printed circuit board in a neighboring insulating housing, this connection between the printed circuit boards is broken when the slide 26 is moved to its opened position). Subsequently, the locked connection effective between the locking jaw 35 and the detent hook 36 is released. The insulating housing 1 is swiveled away from the swivel arm 32. The swivel arm 32 with its locking recess 33 continues to be connected to the top hat rail 34. From the diagram in FIG. 3, it can be seen that in the position I, which corresponds to the operating position for the input/output module that is illustrated in FIGS. 1 and 2, the swivel arm 32 fits against the rear side 30 of the insulating housing 1. In position II, the insulating housing 1 is swiveled away from the swivel arm 32 by 45° and, finally, in position III the insulating housing 1 is swiveled away from the swivel arm 32 by 90°. In this position, the printed circuit board 8 can be pulled easily from the housing 1 in insertion direction 12 by gripping the housing side wall 25. In this case, the pin 7 that moves along the auxiliary line 13 and is assigned to the protective conductor 16 connection, glides through the spring arms 10 of contact spring 9, which in FIG. 4 is located in insertion direction 12 to the left and at the end of the auxiliary line 13.

Figure 3:
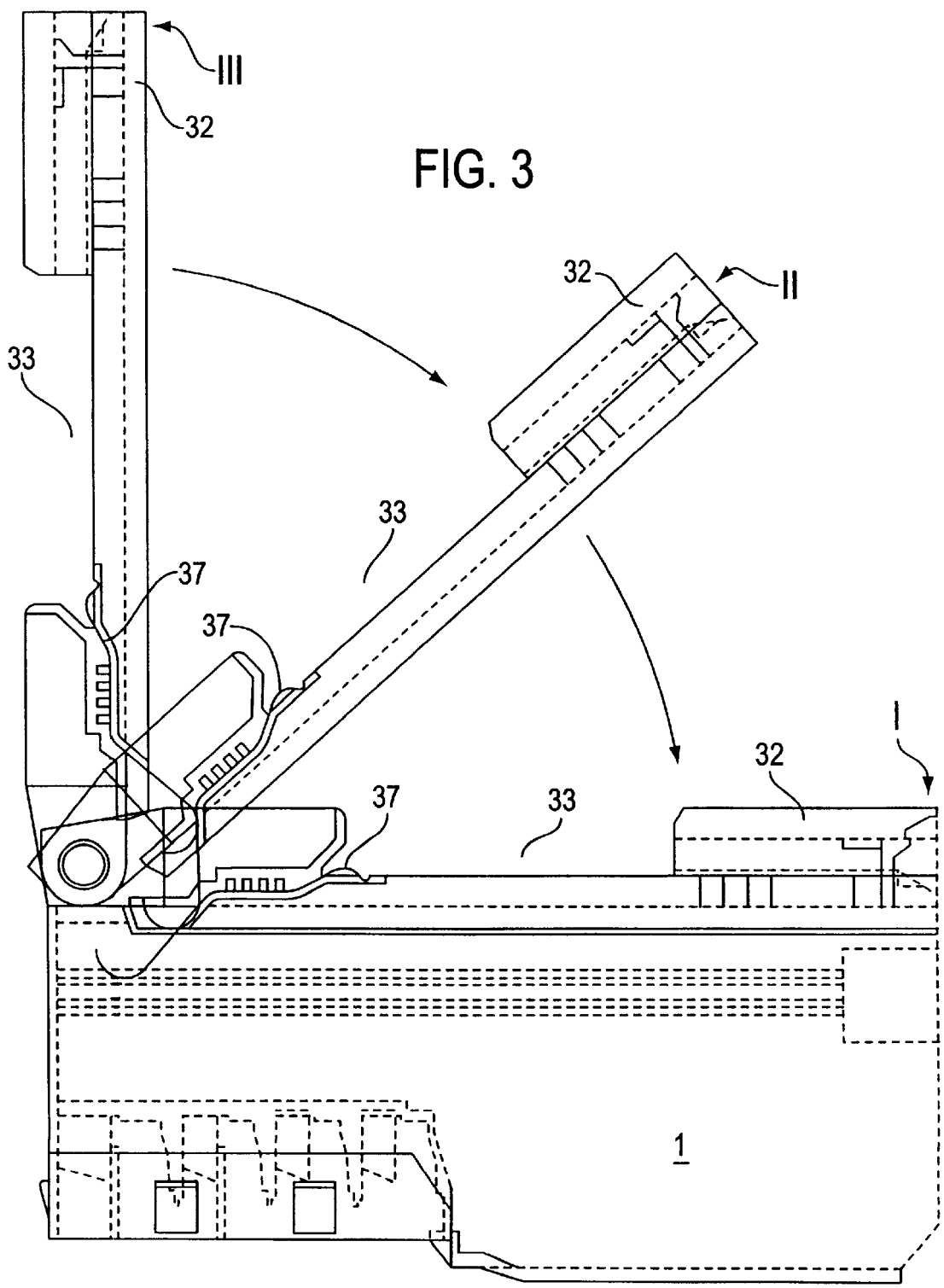
FIG. 3 is another section according to FIG. 2, which is however oriented differently from FIG. 2 with respect to the insulating housing, for demonstrating the three positions of the swivel arm relative to the insulating housing in the operating position (I), in a partially opened position (II), and in a completely opened position (III).

It should be noted that FIG. 3 is intended to show merely that the housing 1 is pivotable with respect to the swivel arm 32. In actual practice the swivel arm 32 would remain locked to the top hat rail 34, and it is the housing 1 that would pivot to different positions while the swivel arm 32 remains stationary.

It will be understood that the above description of the present invention is susceptible to various modifications, changes, and adaptions, and the same are intended to be comprehended within the meaning and range of equivalents of the appended claims.

What we claim is:

1. An input/output module for use with a supporting rail and a data bus having wires, comprising:

an insulating housing;

mounting means for mounting the housing so that the housing is pivotable between first and second positions, the housing being supported on the supporting rail in the first position;

a terminal assembly mounted on the housing, the terminal assembly receiving the wires in a side-by-side arrangement at a surface of the housing;

a printed circuit board having electrical components;

guide means for permitting the printed circuit board to be inserted into the housing like a drawer; and contact means on the printed circuit board for electrically connecting the electrical components to the wires via the terminal assembly when the printed circuit board is fully inserted into the housing.

2. The module of claim 1, wherein the mounting means comprises a swivel arm that is configured to be connected to the supporting rail.

3. The module of claim 2, wherein the supporting rail is a top hat rail and the swivel arm has a locking recess with a shape that complements a portion of the top hat rail.

4. The module of claim 1, wherein the mounting means comprises a swivel arm that is composed of the same material as the housing, and wherein the mounting means further comprises a hinge.

5. The module of claim 1, wherein the housing has a generally rectangular parallelepiped shape with a plurality of rectangular surfaces, the surface at which the terminal assembly receives the wires being one of the rectangular surfaces.

6. The module of claim 1, wherein the terminal assembly comprises a plurality of terminal strips, several terminal strips of varied potential being arranged side-by-side at the surface of the housing.

7. The module of claim 1, wherein the housing has a generally rectangular parallelepiped shape with a plurality of rectangular surfaces, wherein the surface at which the terminal assembly receives the wires is one of the rectangular surfaces, a wherein the mounting means comprises a swivel arm and a hinge adjacent a rectangular surface that is disposed opposite the surface at which the terminal assembly receives the wires.

8. The module of claim 1, wherein the housing has a generally rectangular parallelepiped shape with a plurality of large sides and a plurality of small sides, one of the small sides being open, and wherein the printed circuit board is inserted into the housing via the open small side.

9. The module of claim 8, further comprising a side wall which is connected to the printed circuit board and which closes the open side of the housing when the printed circuit board is fully inserted.

10. The module of claim 9, further comprising a slide that is movably mounted on the side wall, and wherein at least one side of the housing has an opening to receive the slide.

11. The module of claim 10, wherein the slide is provided with electrical contacts to electrically connect the printed circuit board to a printed circuit board in the a neighboring module.

12. The module of claim 9, further comprising an information carrier on the side wall.

13. The module of claim 1, wherein the mounting means comprises a swivel arm that is configured to be connected to the supporting rail, and wherein the module further comprises a spring contact element that is formed onto the swivel arm and that extends through a spring opening in the housing so as to electrically connect the printed circuit board and the supporting rail when the housing is in the first position.

14. The module of claim 1, wherein the terminal assembly comprises pins for electrical connection to the wires, the pins projecting toward the printed circuit board.

15. The module of claim 14, wherein the contact means comprise contact springs, each having two arms which admit a pin between them to electrically connect the contact springs to the pins when the printed circuit board is fully inserted into the housing.

16. The module of claim 15, wherein the arms of at least one of the contact springs have a slot between them so that a pin can be pushed through the slot to a subsequent contact spring as the printed circuit board is being inserted.

17. The module of claim 1, wherein the terminal assembly comprises terminal strips having pins which project toward the printed circuit board, wherein at least one terminal strip has internal bridging, each of the at least one terminal strips having only one of the pins, and wherein the contact means comprises at least one single contact spring on the printed circuit board for electrical connection to the at least one terminal strip via the single pin thereof.

18. The module of claim 1, wherein the terminal assembly comprises first and second terminal strips having connecting openings into which the wires extend, the connecting opening of the first terminal strip being offset from the connecting openings of the second terminal strip, and wherein the module further comprises continuous optical waveguides connected to light emitting diodes, each waveguide being assigned to a respective one of the first and second terminal strips and each light emitting diode being assigned to a respective conductive opening, and wherein the light emitting diodes are offset in accordance with the assigned conductive openings.

* * * * *